United States Patent
Lai et al.

(10) Patent No.: US 10,361,085 B2
(45) Date of Patent: Jul. 23, 2019

(54) FIN FIELD EFFECT TRANSISTOR (FINFET) DEVICE STRUCTURE WITH ULTRA-THIN BODY AND METHOD FOR FORMING THE SAME

(71) Applicant: Taiwan Semiconductor Manufacturing Co., Ltd., Hsinchu (TW)

(72) Inventors: Cheng-Chieh Lai, New Taipei (TW); Kuang-Hsin Chen, Taoyuan (TW); Yung-Chun Wu, Hsinchu (TW); Mu-Shih Yeh, Taipei (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 0 days.

(21) Appl. No.: 15/483,158

(22) Filed: Apr. 10, 2017

(65) Prior Publication Data
US 2017/0213738 A1  Jul. 27, 2017

Related U.S. Application Data

(62) Division of application No. 14/871,361, filed on Sep. 30, 2015, now Pat. No. 9,620,645.

(51) Int. Cl.
| | |
|---|---|
| *H01L 21/28* | (2006.01) |
| *H01L 29/78* | (2006.01) |
| *H01L 29/66* | (2006.01) |
| *H01L 21/3065* | (2006.01) |
| *H01L 21/84* | (2006.01) |
| *H01L 27/12* | (2006.01) |

(52) U.S. Cl.
CPC .... *H01L 21/28114* (2013.01); *H01L 21/3065* (2013.01); *H01L 21/845* (2013.01); *H01L 27/1211* (2013.01); *H01L 29/66545* (2013.01); *H01L 29/66795* (2013.01); *H01L 29/785* (2013.01); *H01L 29/66818* (2013.01)

(58) Field of Classification Search
CPC .......... H01L 21/28114; H01L 21/3065; H01L 21/845
See application file for complete search history.

(56) References Cited

U.S. PATENT DOCUMENTS

2013/0134506 A1   5/2013   Yagishita et al.

OTHER PUBLICATIONS

Yeh et a., "Characterizing the Electrical Properties of a Novel Junctionless Poly-Si Ultrathin-Body Field-Effect Transistor Using a Trench Structure", IEEE Electron Device Letters, vol. 36, No. 2, Feb. 2015, pp. 150-152.
Yeh et al. "High Performance Ultra-Thin Body (2.4nm) Poly-Si Junctionless Thin Film Transistors with a Trench Structure", IEEE, IEDM, 2014, pp. 26.6.1-26.6.4.
(Continued)

*Primary Examiner* — Douglas M Menz
(74) *Attorney, Agent, or Firm* — Haynes and Boone, LLP

(57) ABSTRACT

A method for forming a semiconductor device structure is provided that includes forming an oxide layer over a substrate and forming a semiconductor layer over the oxide layer. The method includes patterning the semiconductor layer to form a fin structure over the oxide layer and removing a portion of the fin structure to form a U-shaped trench in the fin structure. The method also includes forming a gate structure on the U-shaped trench.

20 Claims, 14 Drawing Sheets

(56) References Cited

OTHER PUBLICATIONS

Yeh, "3D IC Applicable Fin Field Effect Transistor and Nonvolatile Memory", A Dissertation Submitted to Department of Engineering and System Science National Tsing Hua University in Partial Fulfillment of the Requirements for the Decree of Doctor of Philosophy in Engineering and System Science, Jan. 2015, pp. 1-156 (181 pages total).

FIN FIELD EFFECT TRANSISTOR (FINFET) DEVICE STRUCTURE WITH ULTRA-THIN BODY AND METHOD FOR FORMING THE SAME

CROSS-REFERENCE TO RELATED APPLICATION

The present application is a divisional application of U.S. patent application Ser. No. 14/871,361, entitled "Fin Field Effect Transistor (FinFET) Device Structure with Ultra-Thin Body and Method for Forming the Same," filed Sep. 30, 2015, now U.S. Pat. No. 9,620,645, which is expressly incorporated by reference herein in its entirety.

BACKGROUND

Semiconductor devices are used in a variety of electronic applications, such as personal computers, cell phones, digital cameras, and other electronic equipment. Semiconductor devices are typically fabricated by sequentially depositing insulating or dielectric layers, conductive layers, and semiconductive layers of material over a semiconductor substrate, and patterning the various material layers using lithography to form circuit components and elements thereon. Many integrated circuits are typically manufactured on a single semiconductor wafer, and individual dies on the wafer are singulated by sawing between the integrated circuits along a scribe line. The individual dies are typically packaged separately, in multi-chip modules, for example, or in other types of packaging.

As the semiconductor industry has progressed into nanometer technology process nodes in pursuit of higher device density, higher performance, and lower costs, challenges from both fabrication and design issues have resulted in the development of three-dimensional designs, such as the fin field effect transistor (FinFET). FinFETs are fabricated with a thin vertical "fin" (or fin structure) extending from a substrate. The channel of the FinFET is formed in this vertical fin. A gate is provided over the fin. Advantages of the FinFET may include reducing the short channel effect and higher current flow.

Although existing FinFET devices and methods of fabricating FinFET devices have generally been adequate for their intended purpose, they have not been entirely satisfactory in all aspects.

BRIEF DESCRIPTION OF THE DRAWINGS

Aspects of the present disclosure are best understood from the following detailed description when read with the accompanying figures. It should be noted that, in accordance with the standard practice in the industry, various features are not drawn to scale. In fact, the dimensions of the various features may be arbitrarily increased or reduced for clarity of discussion.

FIG. 1C' shows a modified structure of the FinFET device structure of FIG. 1C.

DETAILED DESCRIPTION

Figure 1A:
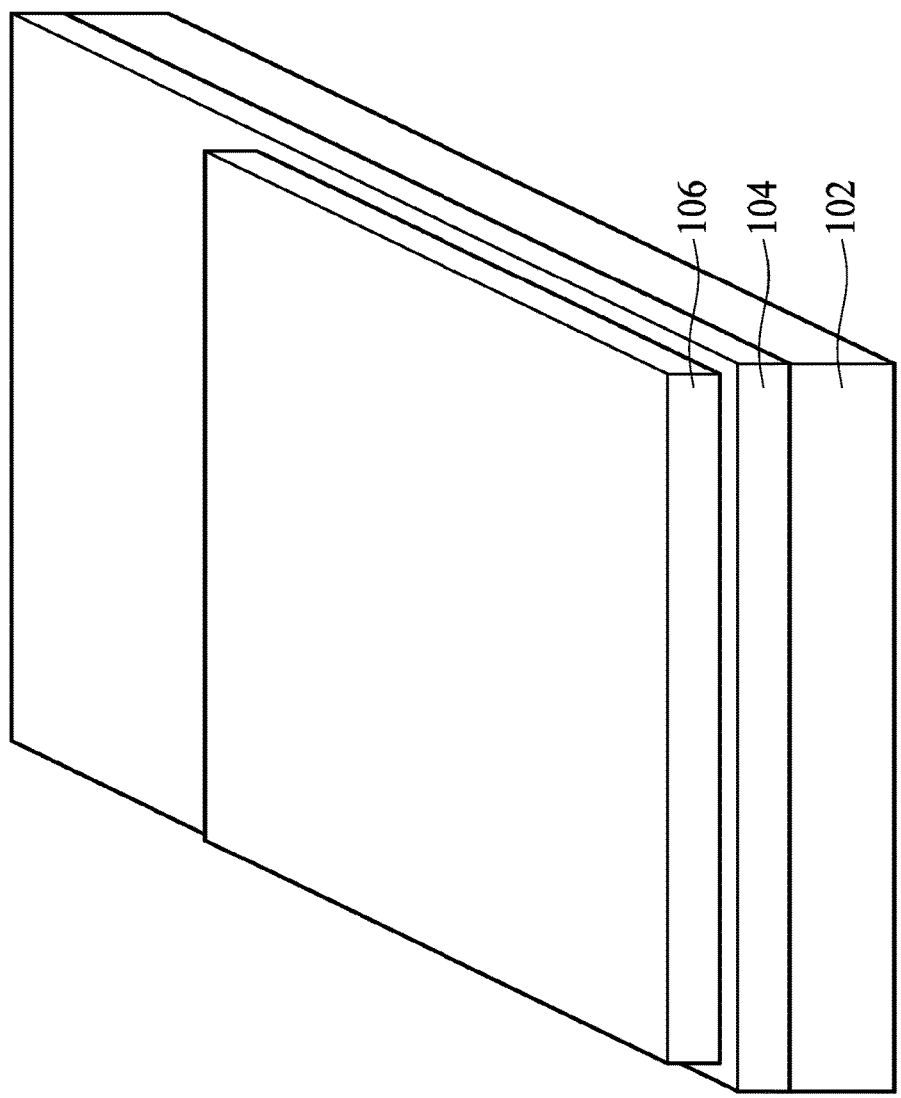
FIGS. 1A, 1B, 1C, and 1D show perspective representations of various stages of forming a FinFET device structure, in accordance with some embodiments of the disclosure.

The following disclosure provides many different embodiments, or examples, for implementing different features of the subject matter provided. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Some variations of the embodiments are described. Throughout the various views and illustrative embodiments, like reference numbers are used to designate like elements. It should be understood that additional operations can be provided before, during, and after the method, and some of the operations described can be replaced or eliminated for other embodiments of the method.

Embodiments for forming a fin field effect transistor (FinFET) device structure are provided. FIGS. 1A-1D show perspective representations of various stages of forming a FinFET device structure 100a, in accordance with some embodiments of the disclosure.

Referring to FIG. 1A, a substrate 102 is provided. The substrate 102 may be made of silicon or other semiconductor materials. Alternatively or additionally, the substrate 102 may include other elementary semiconductor materials such as germanium. In some embodiments, the substrate 102 is made of a compound semiconductor such as silicon carbide, gallium arsenic, indium arsenide, or indium phosphide. In some embodiments, the substrate 102 is made of an alloy semiconductor such as silicon germanium, silicon germanium carbide, gallium arsenic phosphide, or gallium indium phosphide. In some embodiments, the substrate 102 includes an epitaxial layer.

Afterwards, an oxide layer 104 is formed on the substrate 102. In some embodiments, a buried oxide layer is formed on the substrate 102.

Afterwards, a semiconductor layer 106 is formed over the oxide layer 104. The oxide layer 104 is formed between the substrate 102 and the semiconductor layer 106 to inhibit the parasitic capacitance normally produced between a device and the substrate 102.

The semiconductor layer 106 is made of silicon (Si), carbon (C), germanium (Ge), silicon germanium (SiGe), silicon germanium carbon (SiGeC), and a polycrystalline semiconductor or combinations thereof. The semiconductor layer 106 is formed by a deposition process, such as chemical vapor deposition (CVD) process, physical vapor deposition (PVD) process, atomic layer deposition (ALD) process, spin-on coating process, or other applicable processes.

In some embodiments, a silicon-on-insulator (SOI) substrate is constructed by forming the silicon layer as the semiconductor layer 106 over the oxide layer 104. In some embodiments, the silicon layer is deposited by a low-pressure chemical vapor deposition (LPCVD). In some embodiments, the semiconductor layer 106 has a thickness in a range from about 200 nm to about 600 nm.

Figure 1B:
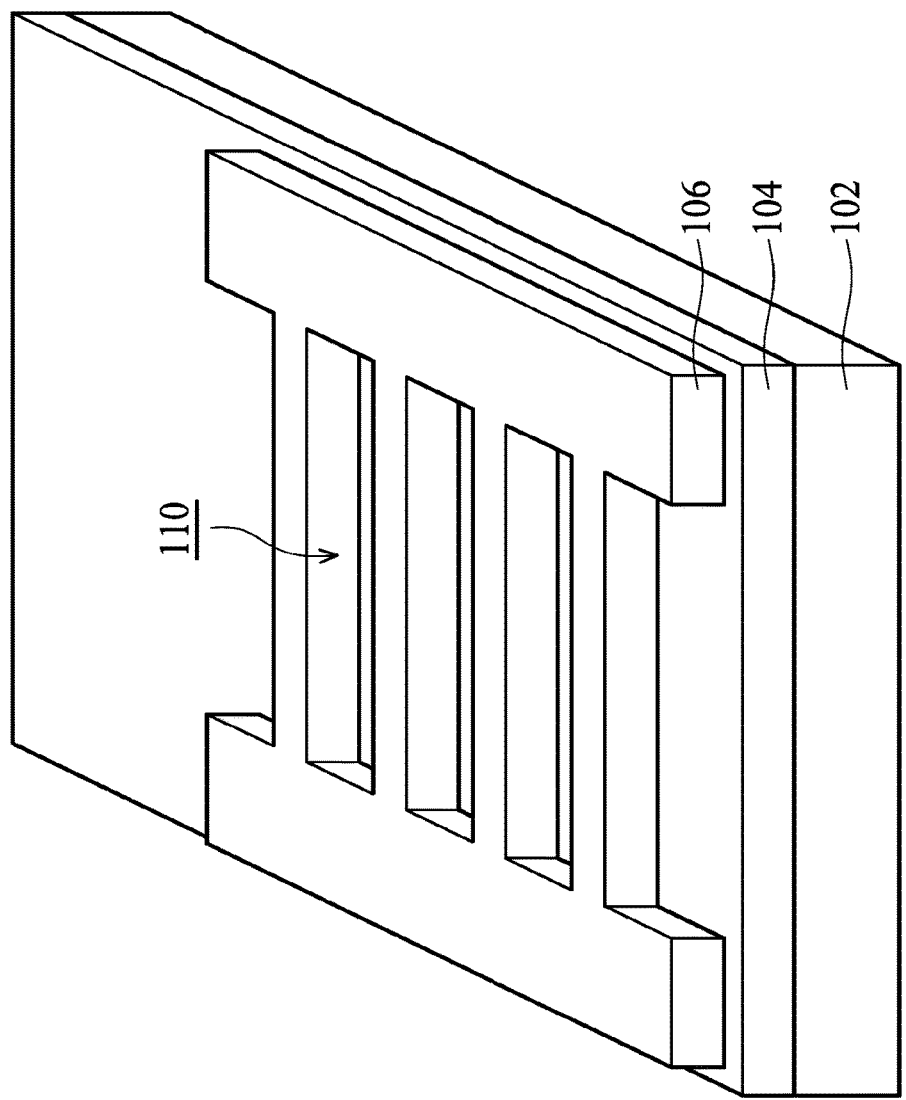

Before performing the operation of FIG. 1B, the semiconductor layer 106 is optionally doped with dopants. The dopants may be N-type dopants, such as arsenic (As), phosphorous (P) or antimony (Sb) or P-type dopants, such as boron (B) or boron fluorine ($BF_2$). In some embodiments, the semiconductor layer 106 has a doping concentration in a range from about 1E14 atom/$cm^2$ to about 5E15 atom/$cm^2$. If the doping concentration is lower than 1E14 atom/$cm^2$, the Ion current may be too low. If the doping concentration is greater than 5E15 atom/$cm^2$, the Ion current may be too high.

The doping may be achieved by an ion implantation process, plasma immersion ion implantation (PIII) process, gas and/or solid source diffusion process, another suitable process or combinations thereof. The semiconductor layer 106 may further be exposed to annealing processes, such as a rapid thermal annealing process. The annealing process is used to activate the dopants. The annealing process includes rapid thermal annealing (RTA) and/or a laser annealing process.

After the semiconductor layer 106 is formed, the semiconductor layer 106 is patterned to form the fin structures over the oxide layer, as shown in FIG. 1B, in accordance with some embodiments of the disclosure.

The fin structures are formed between a first block structure and a second block structure when seen from a top-view. The fin structures are parallel to each other. The trenches 110 are formed between two adjacent fin structures. The number of fin structures may be adjusted according to actual application.

In some embodiments, the semiconductor layer 106 is patterned by a patterning process. The patterning process includes a photolithography process and an etching process. The photolithography process includes photoresist coating (e.g., spin-on coating), soft baking, mask aligning, exposure, post-exposure baking, developing the photoresist, rinsing and drying (e.g., hard baking). The etching process includes a dry etching process or a wet etching process.

Figure 1C:
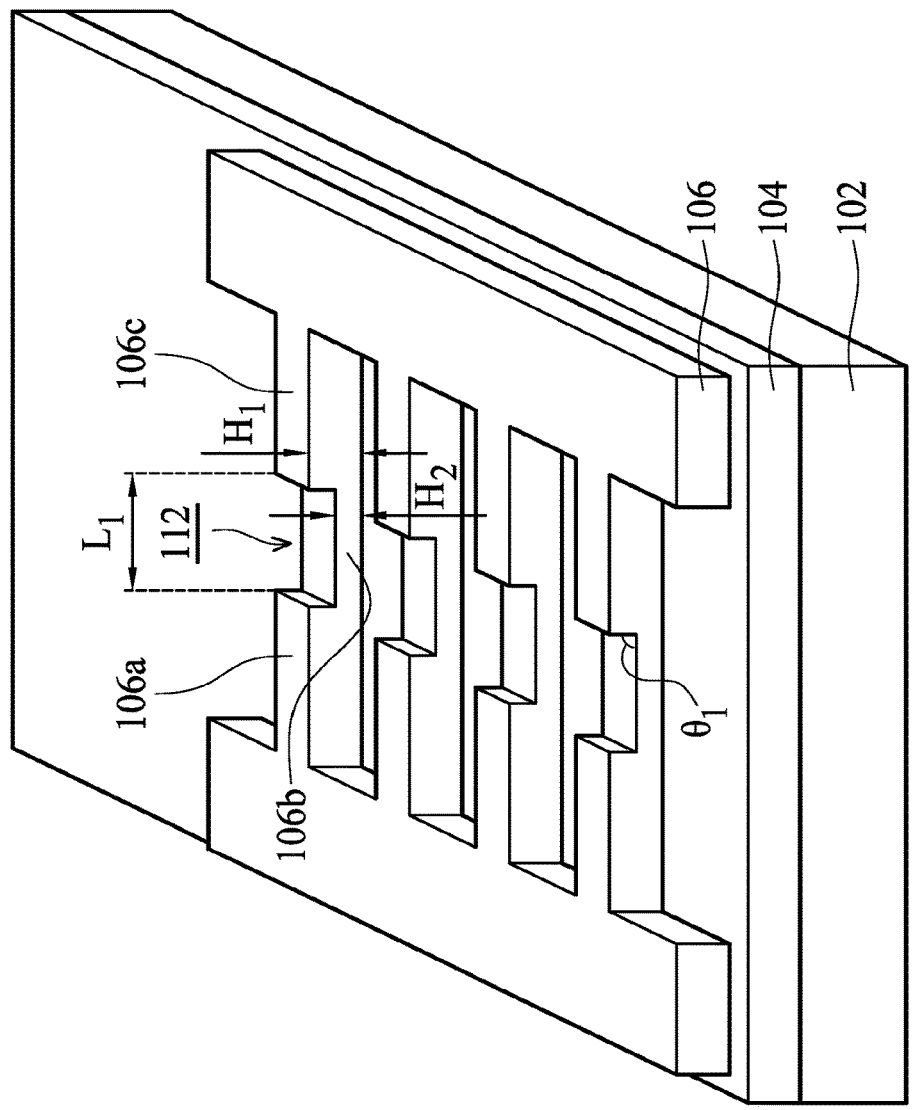
Figure 1C:
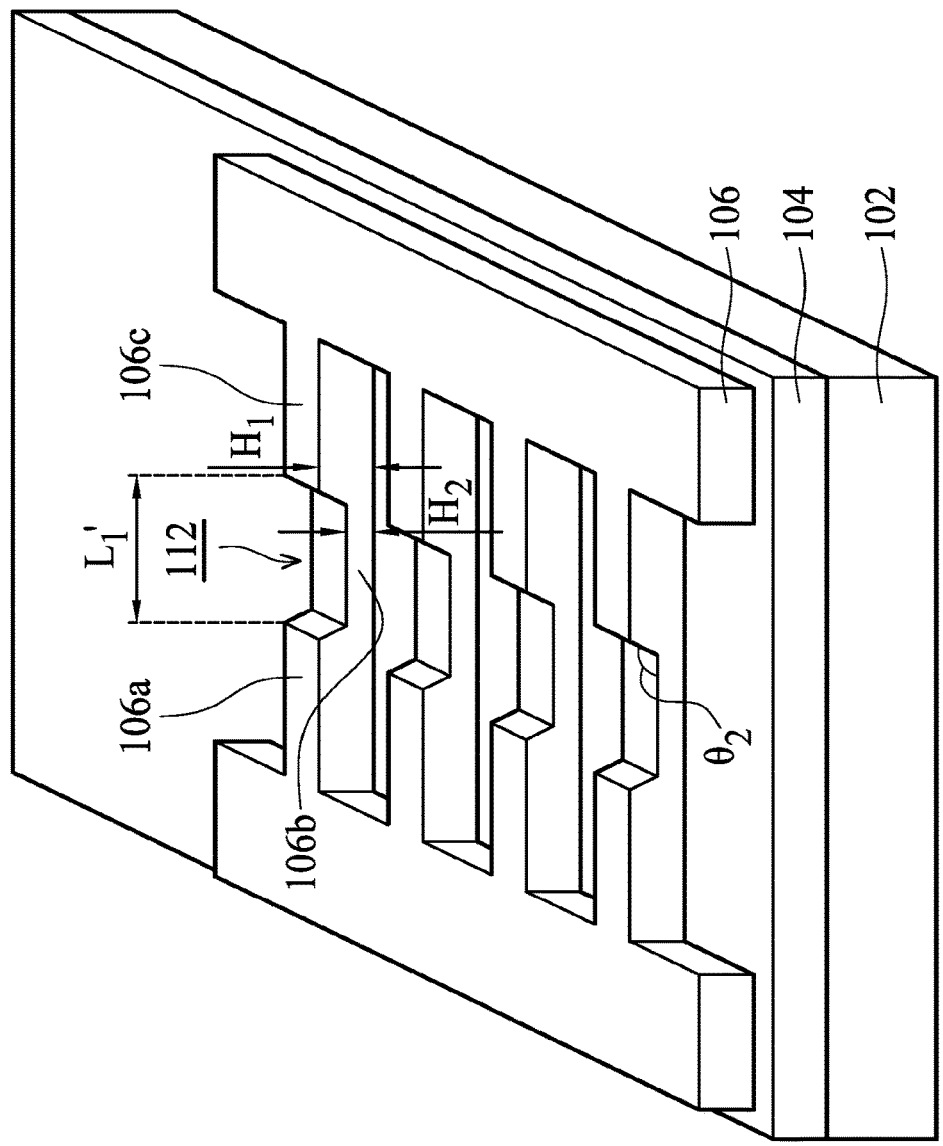

After forming the fin structures over the oxide layer 104, a portion of the fin structure is removed to form a U-shaped trench 112 in the fin structure, as shown in FIG. 1C, in accordance with some embodiments of the disclosure. In some embodiments, the middle portions of the fin structures are removed.

After forming the U-shaped trench 112, the semiconductor layer 106 is divided into three portions according to its function. The semiconductor layer 106 includes a first portion 106a, a second portion 106b and a third portion 106c. The first portion 106a is adjoined to one sidewall of the U-shaped trench 112, and the third portion 106c is adjoined to opposite sidewall of the U-shaped trench 112. The second portion 106b is formed below the bottom surface of the U-shaped trench 112.

As shown in FIG. 1C, a first angle $\theta_1$ between the bottom surface of the U-shaped trench 112 and the sidewall of the U-shaped trench 112 is in a range from about 85 degrees to about 95 degrees. In other words, the sidewall of the U-shaped trench 112 is substantially vertical to the bottom surface of the U-shaped trench 112.

The second portion 106b is formed between the first portion 106a and the third portion 106c. The second portion 106b is formed directly below the U-shaped trench 112, and the first portion 106a and the third portion 106c are the sidewalls of the U-shaped trench 112.

The first portion 106a is configured as a source structure, the second portion 106b is configured as a channel region (or called body region) and the third portion 106c is configured as a drain structure. In other words, the source structure, the channel region and the drain structure construct a U-shaped trench 112, and the channel region is formed directly below a bottom surface of the U-shaped trench 112. The source structure and the drain structure protrude above the oxide layer 104.

In some embodiments, the first portion 106a (or the third portion 106c) has a first height $H_1$ which is measured form a top surface of the oxide layer 104 to a top surface of the first portion 106a (or the third portion 106c). In some embodiments, the first height $H_1$ is in a range from about 30 nm to about 100 nm.

In some embodiments, the second portion 106b has a second height $H_2$ which is measured form a top surface of the oxide layer 104 to a bottom surface of the U-shaped trench 112. In other words, the second portion 106b has a thickness $H_2$. In some embodiments, the second height $H_2$ is in a range from about 1 nm to about 20 nm. If the second height $H_2$ is smaller than 1 nm, the performance of FinFET structure device 100 may be degraded and fabrication process may be difficult. If the second height $H_2$ is greater than 20 nm, the leakage current may increase. In some embodiments, the second height ($H_2$) is smaller than the first height ($H_1$).

In some embodiments, the U-shaped trench 112 has a trench length $L_1$ which is measured from a sidewall of the first portion 106a to a sidewall of the third portion 106c. In some embodiments, the trench length $L_1$ is in a range from about 1 nm to about 1000 nm.

The U-shaped trench 112 is formed by performing an etching process. In some embodiments, the etching process is a dry etching process. In some embodiments, the U-shaped trench 112 is formed by a reactive-ion etching (RIE) process. If the etching process is wet etching process, the etching amount and the shape of trench are difficult to control. In addition, the thickness of the second portion 106b may be varied by the wet etching process. In contrast to the wet etching process, the dry etching process is an anisotropic etching process and it is easy to control. Therefore, the second portion 106b has an uniform thickness. The variations in the performance of the FinFET device structure 100 is suppressed by forming the uniform thickness of the second portion 106b (or channel region).

It should be noted that the first portion 106a, the second portion 106b and the third portion 106c are formed simultaneously. In other words, the source structure, the channel region and the drain structure all made of the same material, and therefore a junctionless mode FinFET device structure 100a is obtained. In some other embodiments, when the semiconductor layer 106 is doped with n-type dopants or p-type dopants, the first portion 106a, the second portion 106b, and third portion 106c are doped with dopants of the same conductive type and the same or substantially the same concentration. The advantage of the junctionless mode transistor is that the all dopant diffusion and statistical spread problems are eliminated. Another advantage of the junctionless mode transistor is that there is no electron reflection and no energy dissipation in the FinFET device structure 100a.

Figure 1D:
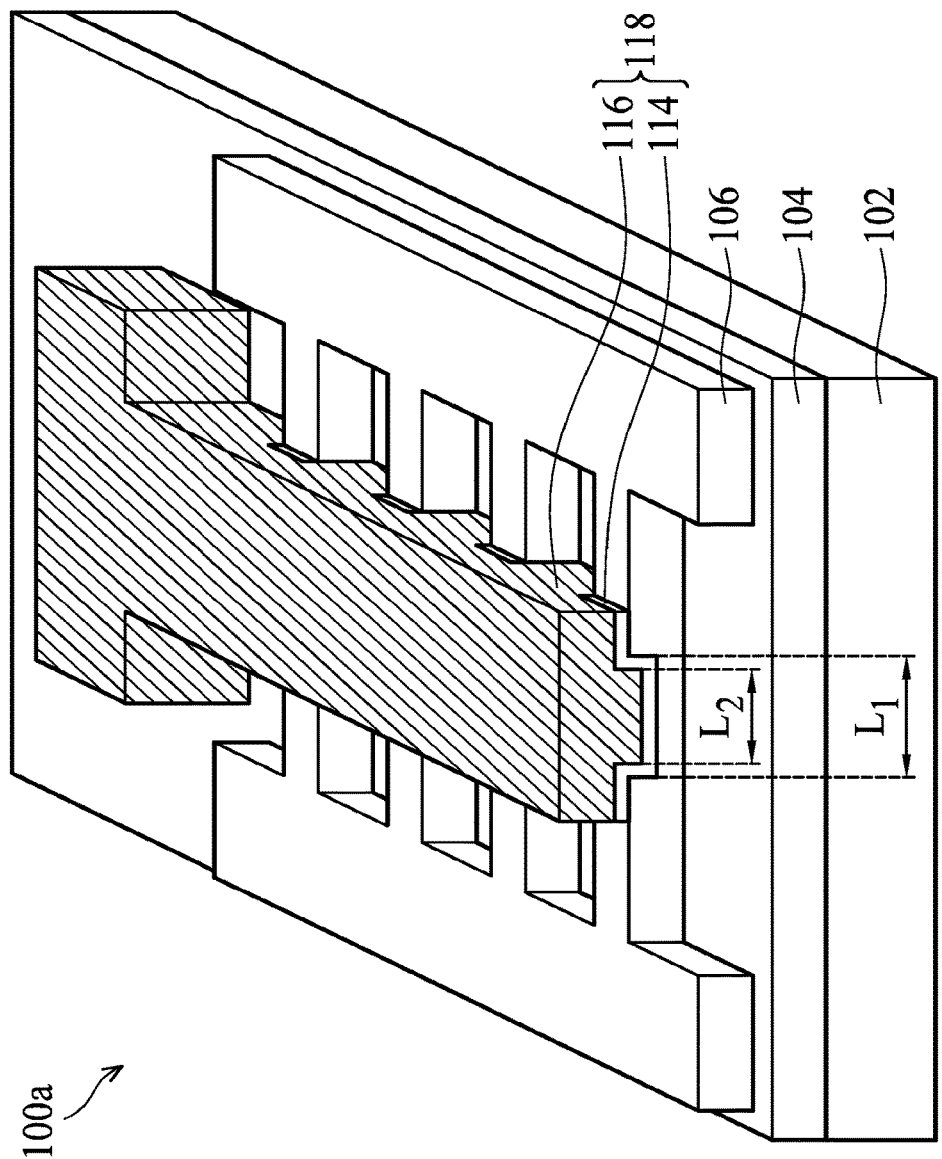

Because the second portion 106b (the channel region) has a small thickness, an ultra-thin body (UTB) FinFET device structure 100a is obtained. It should be noted that the leakage current is controlled by using of the ultra-thin body (UTB), which is significantly smaller than the gate length $L_2$ (FIG. 1D).

FIG. 1C' shows a modified structure of the FinFET device structure 100a of FIG. 1C. As shown in FIG. 1C', the U-shaped trench 112 has sloped sidewall, and has a narrow bottom surface and a wide opening. The trench length $L_1'$ of the U-shaped trench 112 is the length of the opening in a horizontal direction. In some embodiments, a second angle $\theta_2$ between the bottom surface of the U-shaped trench 112 and the sidewall of the U-shaped trench 112 is in a range from about 90 degrees to about 145 degrees.

After the U-shaped trench 112 is formed, a gate structure 118 is formed in the U-shaped trench 112 and on the semiconductor layer 106. Afterwards, the gate structure 118 is patterned to form a T-shaped structure as shown in FIG. 1D, in accordance with some embodiments of the disclosure. The T-shaped structure is used to fabricate contact structure (not shown) which will be formed after. Numerous other layers may also be present in the gate structures, for example, capping layers, interface layers, spacer elements, and/or other suitable features.

The gate structure 118 includes a gate dielectric layer 114 and a gate electrode layer 116. The gate dielectric layer 114 may be a single layer or multiple layers. In some embodiments, the gate dielectric layer 114 may be a dummy gate dielectric layer which will be replaced by the real gate dielectric layer. In some embodiments, the gate dielectric layer 114 is made of silicon oxide (SiOx), silicon nitride (SixNy), silicon oxynitride (SiON) or combinations thereof. In some embodiments, the gate dielectric layer 114 is made of high-k dielectric materials. Examples of high-k dielectric materials include hafnium oxide, zirconium oxide, aluminum oxide, hafnium dioxide-alumina alloy, hafnium silicon oxide, hafnium silicon oxynitride, hafnium tantalum oxide, hafnium titanium oxide, hafnium zirconium oxide, the like, or combinations thereof.

In some embodiments, as shown in FIG. 1D, the dielectric layer 114 is made of silicon dioxide ($SiO_2$), and it is formed by consuming a portion of the semiconductor layer 106. It should be noted that the dielectric layer 114 is only formed over the semiconductor layer 106, but not over the oxide layer 104. Therefore, a portion of the gate electrode layer 116 is directly formed on and in direct contact with the oxide layer. In some other embodiments, the gate dielectric layer 112 is deposited by a thermal oxide process, plasma enhanced chemical vapor deposition (PECVD) process or by a spin coating process.

In some other embodiments, when the dielectric layer 114 is made of high-k dielectric layer, the dielectric layer 114 is formed on not only semiconductor layer 106 but also oxide layer 104. In some other embodiments, when the dielectric layer 114 is made of high-k dielectric layer, the dielectric layer 114 is formed by atomic layer deposition (ALD) process.

The gate electrode layer 116 may be a single layer or multiple layers. In some embodiments, the gate electrode layer 116 may be a dummy gate electrode layer which will be replaced by the real gate electrode layer. In some other embodiments, the gate electrode layer 116 is made of polysilicon or the conductive material. The conductive material may be aluminum (Al), copper (Cu), tungsten (W), titanium (Ti), tantalum (Ta), or other applicable materials.

The gate electrode layer 116 is formed by a deposition process, such as chemical vapor deposition (CVD), physical vapor deposition (PVD), atomic layer deposition (ALD), high density plasma CVD (HDPCVD), metal organic CVD (MOCVD), or plasma enhanced CVD (PECVD).

It should be noted that the gate structure 118 is filled into the U-shaped trench 112 and extended over a portion of the first portion 106a and a portion of the third portion 106c of the semiconductor layer 106. In addition, a portion of gate electrode layer 116 is directly formed on the oxide layer 104. The gate electrode layer 116 traverses over middle portions of the fin structures.

In some embodiments, the gate length $L_2$ of the gate structure 118 is in a range from about 1 nm to about 1000 nm. If the gate length $L_2$ is smaller than 1 nm, the fabrication process may be difficult. If the gate length $L_2$ is greater than 1000 nm, the Ion current may be too small It should be noted that the gate length $L_2$ of the gate structure 118 is smaller than the trench length $L_1$ of the U-shaped trench 112. Since the thickness $H_2$ of the channel region (the second portion 106b of the semiconductor layer 106) is obviously smaller than the gate length $L_2$, the leakage current is well controlled. Furthermore, the performance of the FinFET device structure 100a is improved.

Afterwards, an inter-layer dielectric (ILD) structure (not shown) is formed over the gate structure 118 and over the semiconductor layer 106 and the oxide layer 104.

The ILD structure 120 may include multilayers made of multiple dielectric materials, such as silicon oxide, silicon nitride, silicon oxynitride, tetraethoxysilane (TEOS), phosphosilicate glass (PSG), borophosphosilicate glass (BPSG), low-k dielectric material, and/or other applicable dielectric materials. Examples of low-k dielectric materials include, but are not limited to, fluorinated silica glass (FSG), carbon doped silicon oxide, amorphous fluorinated carbon, parylene, bis-benzocyclobutenes (BCB), or polyimide. The ILD structure 120 may be formed by chemical vapor deposition (CVD), physical vapor deposition, (PVD), atomic layer deposition (ALD), spin-on coating, or other applicable processes.

Afterwards, the FinFET device structure 100a may continue to undergo other processes to form other structures or devices. In some embodiments, metallization includes vertical interconnects, such as conventional vias or contacts, and horizontal interconnects, such as metal lines. The various interconnection features may implement various conductive materials including copper, tungsten, and/or silicide.

FIGS. 2A-2E show cross-sectional representations of various stages of forming a FinFET device structure 100a, in accordance with some embodiments of the disclosure.

Figure 2A:
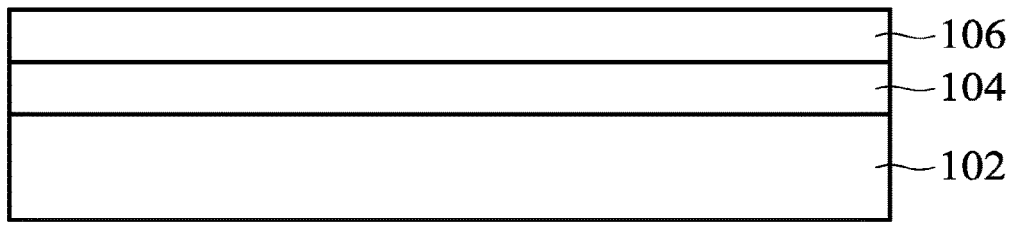
FIGS. 2A, 2B, 2C, 2D, and 2E show cross-sectional representations of various stages of forming a FinFET device structure, in accordance with some embodiments of the disclosure.

As shown in FIG. 2A, the oxide layer 104 and the semiconductor layer 106 are sequentially formed over the substrate 102. In some embodiments, silicon dioxide ($SiO_2$) layer is grown on the substrate 102, and a silicon (Si) layer is deposited over the silicon dioxide layer by low-pressure chemical vapor deposition (LPCVD) process.

After the semiconductor layer 106 is formed over the oxide layer 104, the semiconductor layer 106 may be optionally doped with dopants. The dopants may be n-type or p-type dopants.

Afterwards, the semiconductor layer 106 is patterned to form the fin structures between two block structures. The two block structures have a large area which helps to form the contact structure (not shown). The fin structures are parallel to each other. The trenches 110 are formed between two adjacent fin structures. The number of fin structures may be adjusted according to actual application.

Figure 2B:
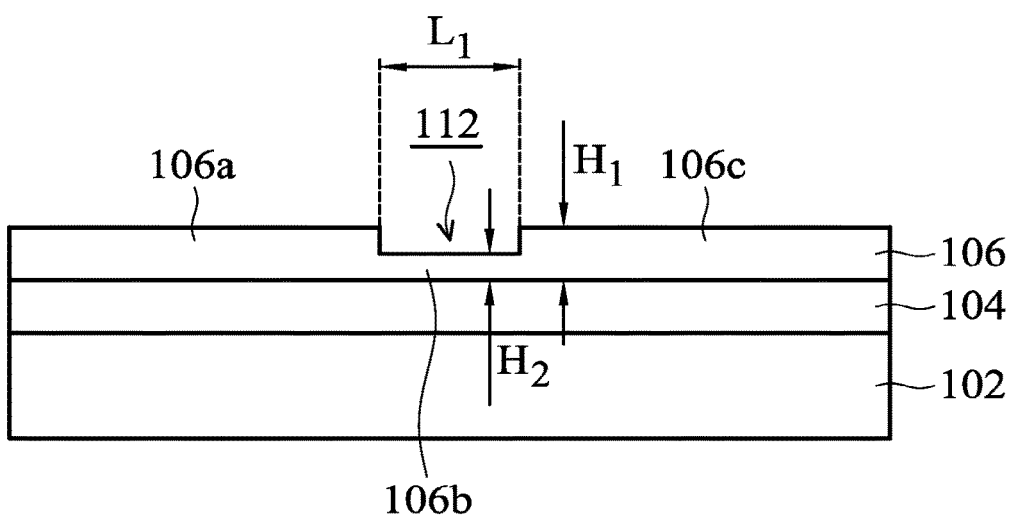

Afterwards, the U-shaped trench 112 is formed in a middle portion of the fin structure as shown in FIG. 2B, in accordance with some embodiments of the disclosure. As a result, the semiconductor layer 106 is divided into three portions including first portion 106a, the second portion 106b and the third portion 106c. In other words, the first portion 106a, the second portion 106b and the third portion 106c construct the U-shaped trench 112.

In some embodiments, the first portion 106a is configured as a source structure, the second portion 106b is configured as a channel region (or body region), and the third portion 106c is configured as a drain structure. As mentioned above, the semiconductor layer 106 may be doped with dopants. Once the semiconductor layer 106 is doped, the first portion 106a (source structure), the second portion 106b (channel region) and the third portion 106c (drain structure) are simultaneously doped with dopants. Therefore, a junction-less mode transistor is obtained. The advantage of the junctionless mode transistor is that the all dopant diffusion and statistical spread problems are eliminated. Another advantage of the junctionless mode transistor is that there is no electron reflection and no energy dissipation in the FinFET device structure 100a.

It should be noted that the second portion 106b is directly below the bottom surface of the U-shaped trench 112. The second portion 106b (also called a channel region) is very thin and has a second height $H_2$. In some embodiments, the second height $H_2$ is in a range from about 1 nm to about 20 nm.

It should be noted that the U-shaped trench 112 is formed by a dry etching process, and the shape the U-shaped trench 112 is easily controlled. In addition, the U-shaped trench 112 has an uniform second height $H_2$ (the thickness of the channel region) to suppress variations in performance of the FinFET device structure 100a.

The U-shaped trench 112 has a trench length $L_1$ which is measure from a sidewall of the first portion 106a to a sidewall of the third portion 106c. The U-shaped trench 112 is configured to dispose the gate structure 118, and the gate length $L_2$ is smaller than the trench length $L_1$ of the U-shaped trench 112. In some embodiments, the gate length $L_2$ is in a range from about 1 to about 1000 nm. If the gate length $L_2$ is smaller than 1 nm, the fabrication process may be difficult. If the gate length $L_2$ is greater than 1000 nm, the Ion current may be too small.

Figure 2C:
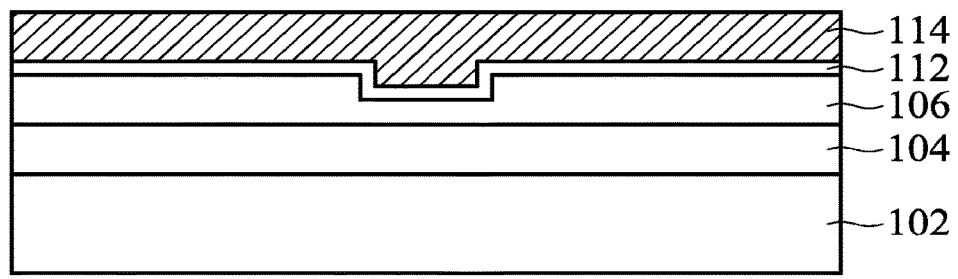

Afterwards, the gate dielectric layer 114 and the gate electrode layer 116 are sequentially deposited on the U-shaped trench 112 and the semiconductor layer 106 as shown in FIG. 2C, in accordance with some embodiments of the disclosure.

Figure 2D:
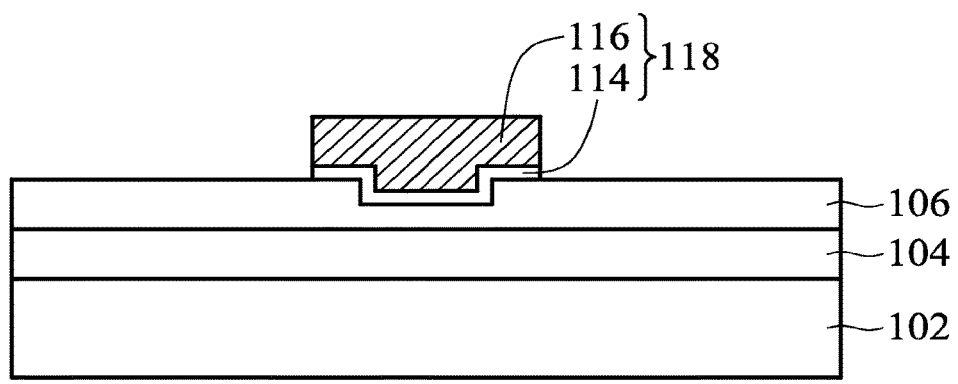

Afterwards, the gate electrode layer 116 is patterned as shown FIG. 2D, in accordance with some embodiments of the disclosure. A portion of the gate structure 118 is filled in the U-shaped trench 112 and a portion of the gate structure 118 is extended over a portion of the first portion 106a or a portion of the third portion 106c of the semiconductor layer 106.

Figure 2E:
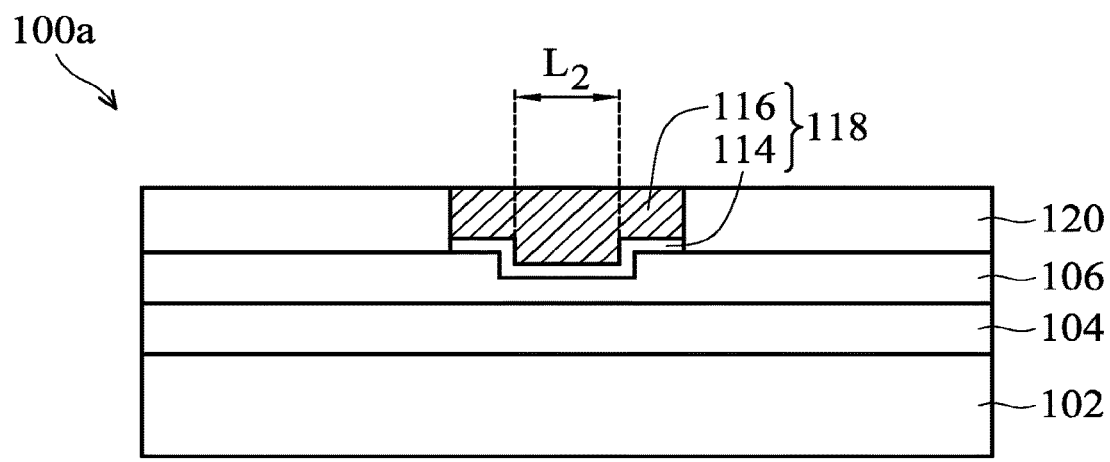

After forming the gate structure 118, a dielectric layer is formed over the gate structure 118 and the semiconductor layer 106, as shown in FIG. 2E, in accordance with some embodiments of the disclosure. Afterwards, a polishing process is performed to the ILD structure 120 until a top surface of the gate structure 118 is exposed.

It should be noted that the gate length $L_2$ is smaller than the trench length $L_1$ of the U-shaped trench 112. The short channel effect (SCE) is minimized when a high drive current is achieved at a scaled down gate length $L_2$ of the gate structure 118. In addition, the FinFET device structure 100a with an ultra-thin body (UTB) has a high $I_{on}/I_{off}$ current, because the ultra-thin body (UTB) provides good gate control ability. The FinFET device structure 100a has a lower drain-induced barrier lowering (DIBL) (0 mV/V) and low subthreshold swing (SS) value (such as about 100 mV/dec.). The subthreshold swing (SS) value is defined by an amount of gate voltage increase required to produce a decade change in drain current.

Furthermore, the FinFET device structure 100a has a high saturation current. In the FinFET device structure 100a, most of electrons pass through the middle area of the ultra-thin body (UTB) (such as second portion 106b of the semiconductor layer 106) and the current of the FinFET device structure 100a does not pass through the surface of the ultra-thin body (UTB). Therefore, interface scattering is reduced and mobility is thereby improved. As a result, the FinFET device structure 100a has high electron density and fast electron velocity.

Figure 3A:
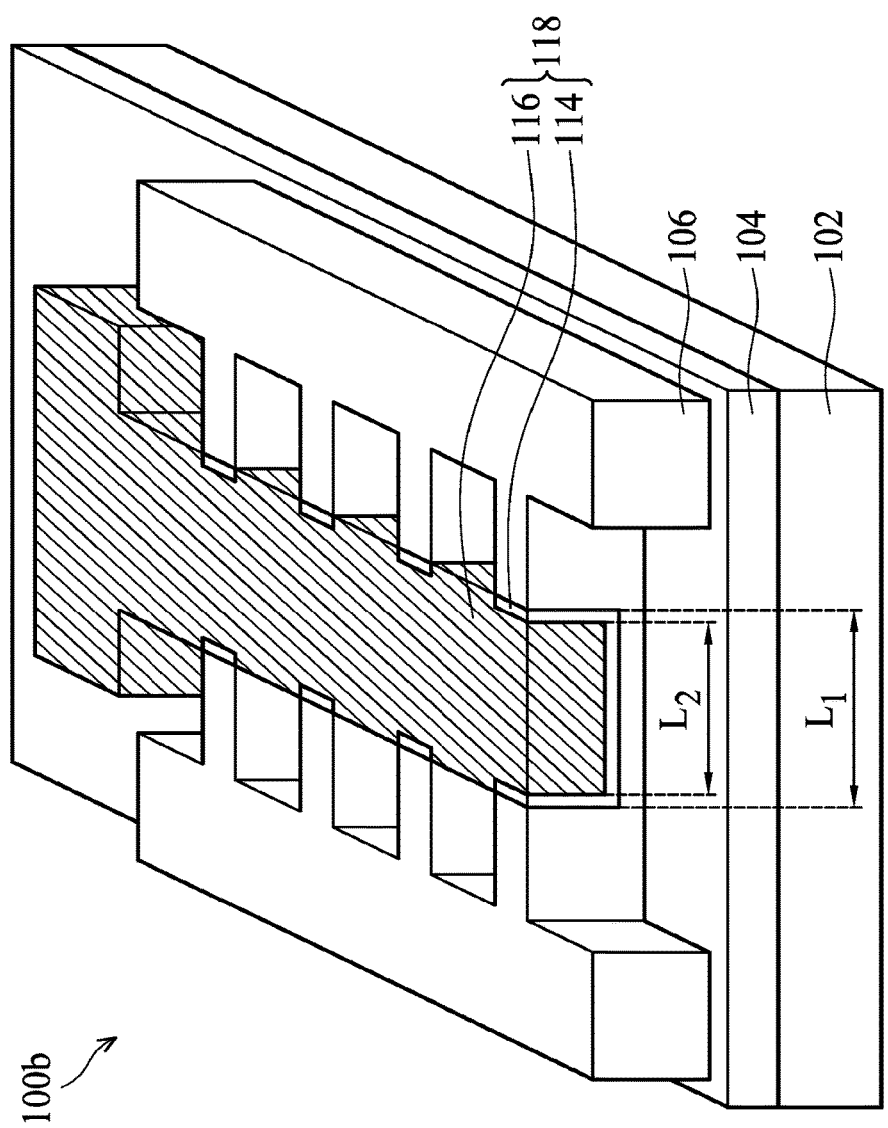
FIG. 3A shows a perspective representation of the FinFET device structure 100b, in accordance with some embodiments of the disclosure.

FIG. 3A shows a perspective representation of the FinFET device structure 100b, in accordance with some embodiments of the disclosure.

The structure of FIG. 3A is obtained by performing a polishing process on the structure of FIG. 1D. In some embodiments, the polishing process is a chemical mechanical polishing (CMP) process.

It should be noted that after the polishing process, a top surface of the gate structure 118 is level with a top surface of the first portion 106a or that of the third portion 106c of the semiconductor layer 106. The gate structure 118 is fully filled in the U-shaped trench 112 and extended over a portion of the oxide layer 104. It should be noted that the gate length $L_2$ of the gate structure 118 is smaller than the trench length $L_1$ of the U-shaped trench 112, and therefore, the size of the gate length $L_2$ is dependent on the size of the trench length $L_1$. Compared with FIG. 1D, the gate structure of FIG. 3A has a smaller gate length $L_2$.

Figure 3B:
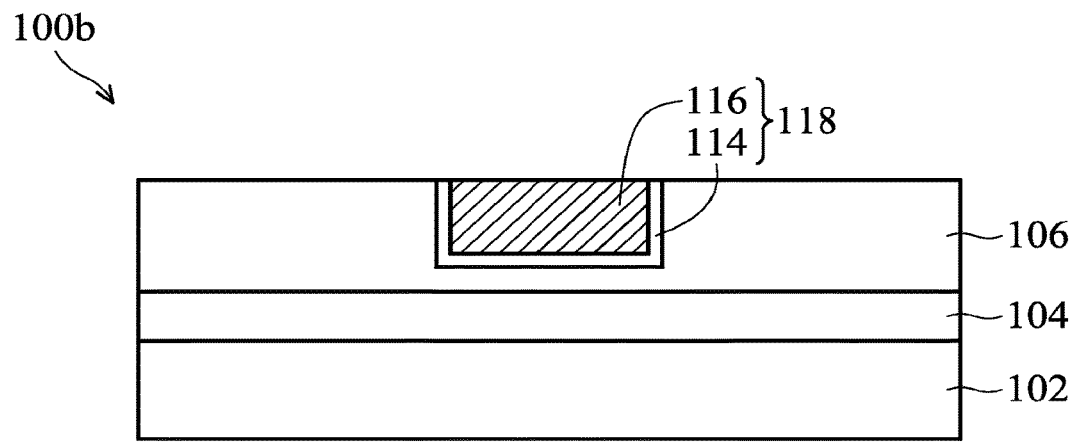
FIGS. 3B-3C show cross-sectional representations of various stages of forming a FinFET device structure, in accordance with some embodiments of the disclosure.
Figure 3C:
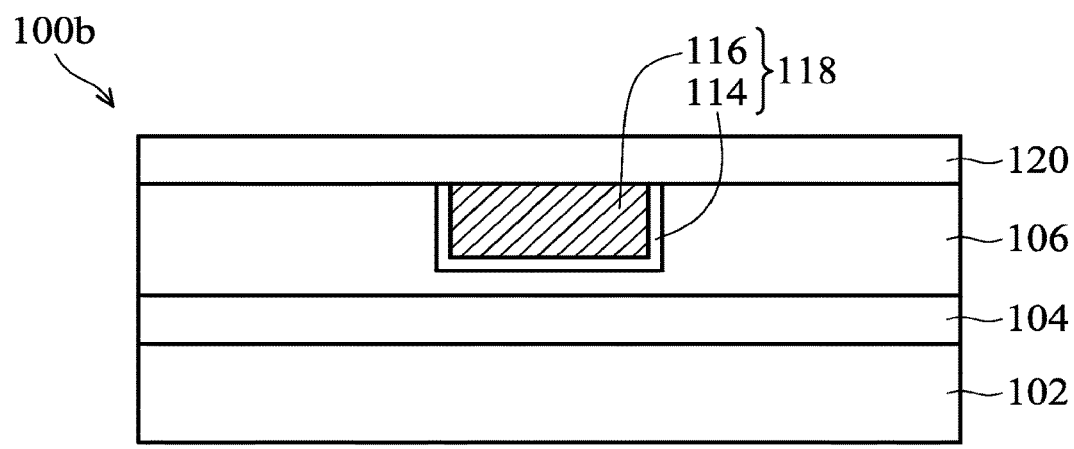

FIGS. 3B-3C show cross-sectional representations of various stages of forming a FinFET device structure 100b, in accordance with some embodiments of the disclosure. The FinFET device structure 100b is similar to, or the same as, the FinFET device structure 100a as shown in FIG. 2E, except the shape of the gate structure 118 is different. Processes and materials used to form the FinFET device structure 100b may be similar to, or the same as, those used to form the FinFET device structure 100a and are not repeated herein.

As shown in FIG. 3B, the gate structure 118 is fully filled into the U-shaped trench 112.

Afterwards, the ILD structure 120 is formed over the gate structure 118 and the semiconductor layer 106, as shown in FIG. 3C, in accordance with some embodiments of the disclosure.

Figure 4A:
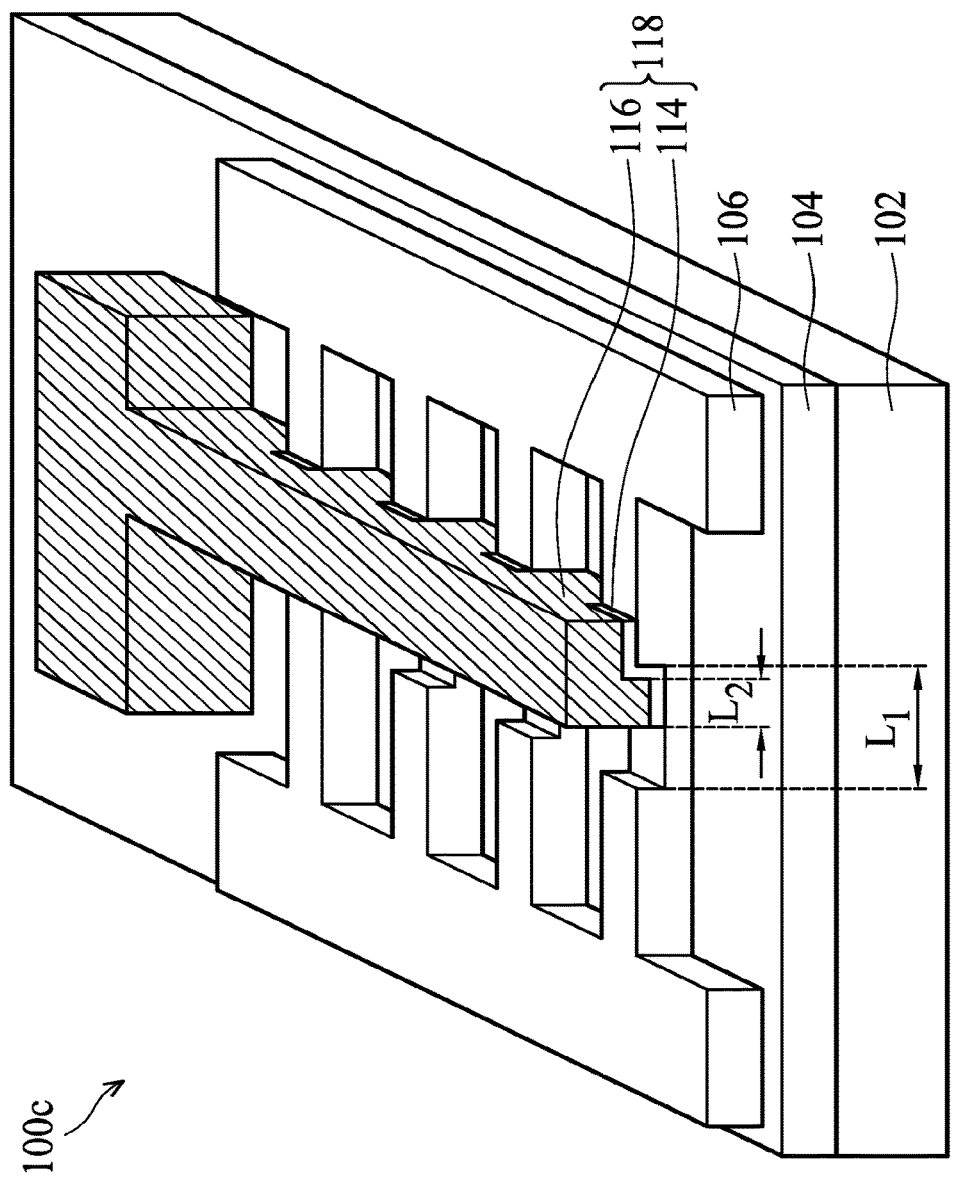
FIG. 4A shows a perspective representation of the FinFET device structure, in accordance with some embodiments of the disclosure.

FIG. 4A shows a perspective representation of the FinFET device structure 100c, in accordance with some embodiments of the disclosure. The gate electrode layer 116 is formed in a portion of the U-shaped trench 112. It should be noted that the U-shaped trench 112 is not completely filled with the gate structure 118.

Figure 4B:
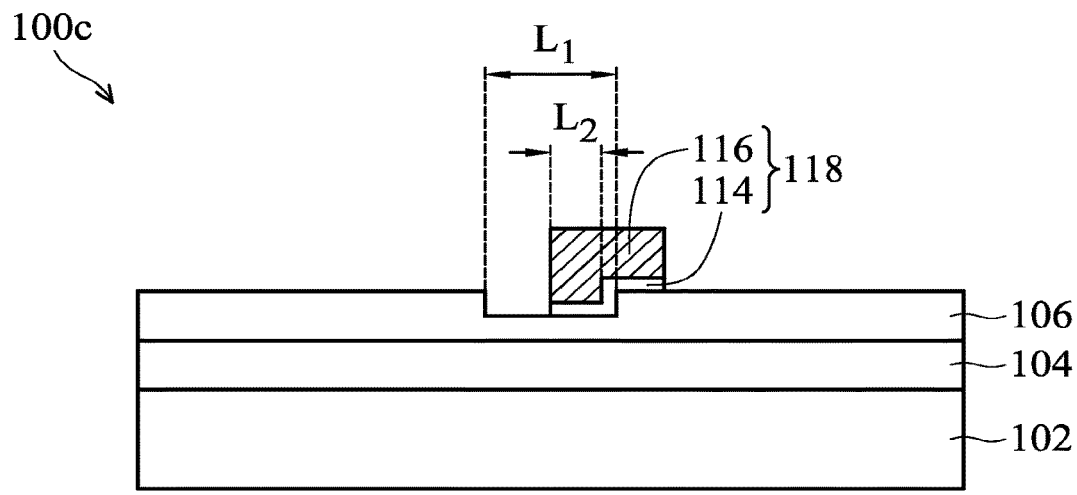
FIGS. 4B-4C show cross-sectional representations of various stages of forming a FinFET device structure, in accordance with some embodiments of the disclosure.
Figure 4C:
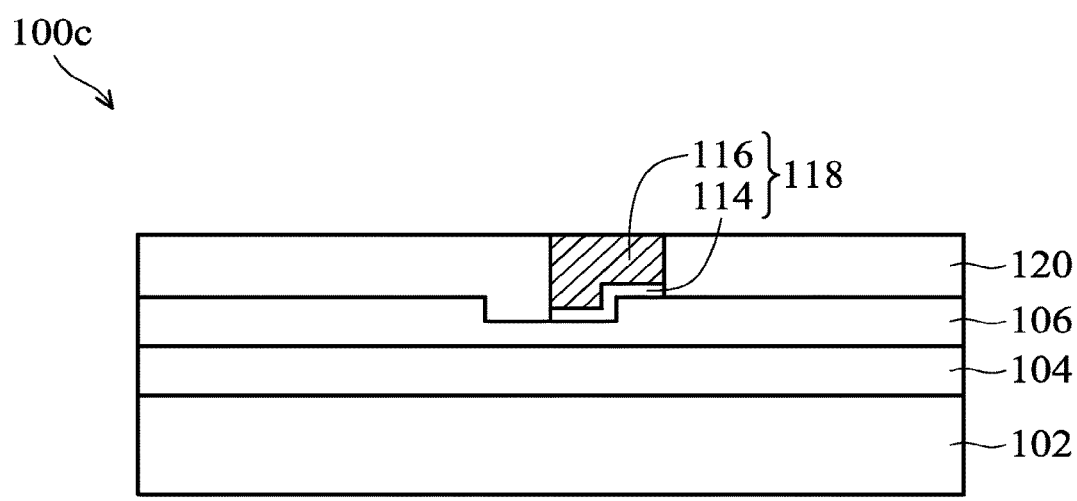

FIGS. 4B-4C show cross-sectional representations of various stages of forming a FinFET device structure 100c, in accordance with some embodiments of the disclosure. The FinFET device structure 100c is similar to, or the same as, the FinFET device structure 100a as shown in FIG. 2E, except the shape of the gate structure 118 is different. Processes and materials used to form the FinFET device structure 100b may be similar to, or the same as, those used to form the FinFET device structure 100a and are not repeated herein.

As shown in FIG. 4B, the U-shaped trench 112 has a trench length $L_1$ and the gate electrode layer 116 has a gate length $L_2$. The trench length $L_1$ is greater than the gate length $L_2$. In some embodiments, the gate length $L_2$ is about half of the trench length $L_1$.

After the gate electrode layer 116 is formed, the ILD structure 120 is formed in another portion of the U-shaped trench 112.

Figure 5A:
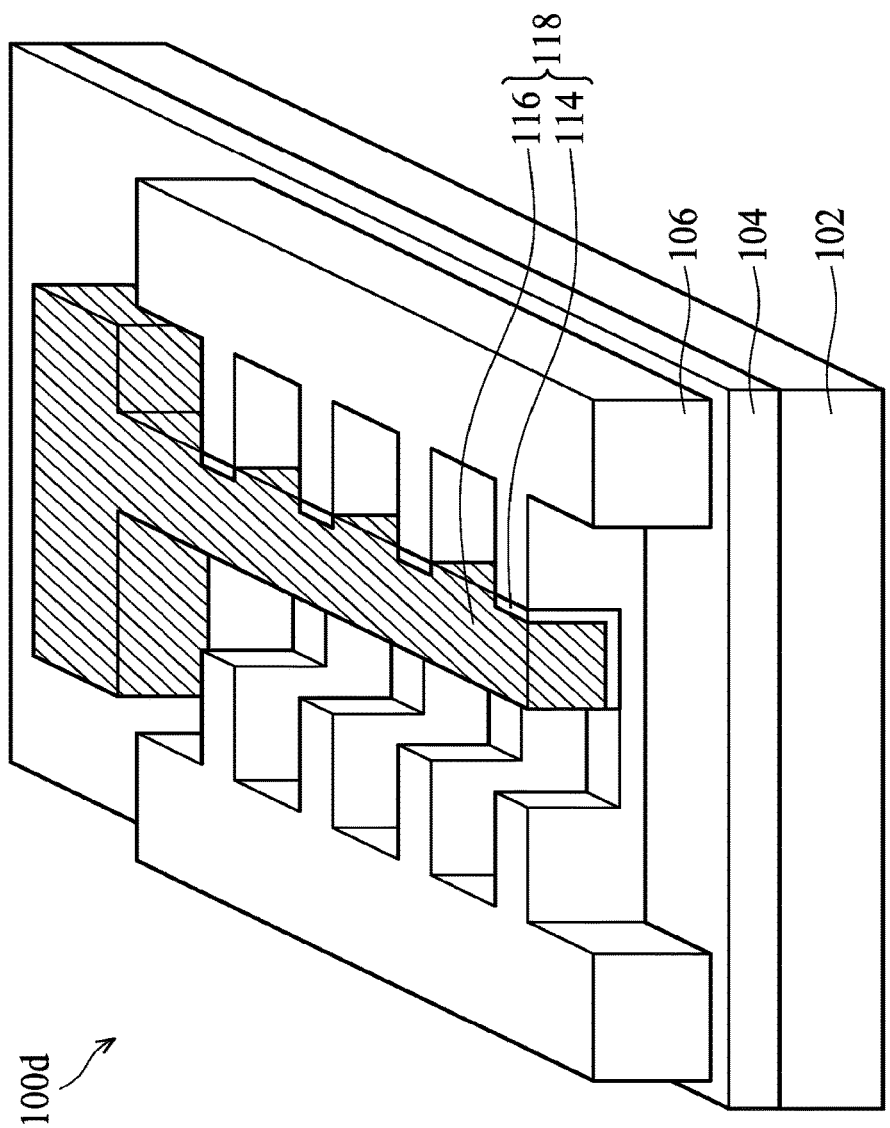
FIG. 5A shows a perspective representation of the FinFET device structure, in accordance with some embodiments of the disclosure.

FIG. 5A shows a perspective representation of the FinFET device structure 100d, in accordance with some embodiments of the disclosure. The FinFET device structure 100d is similar to, or the same as, the FinFET device structure 100c as shown in FIG. 4A, except the shape of the gate structure 118 is different. As shown in FIG. 5A, a top surface of the gate electrode layer 116 is level with a top surface of the semiconductor layer 106.

Figure 5B:
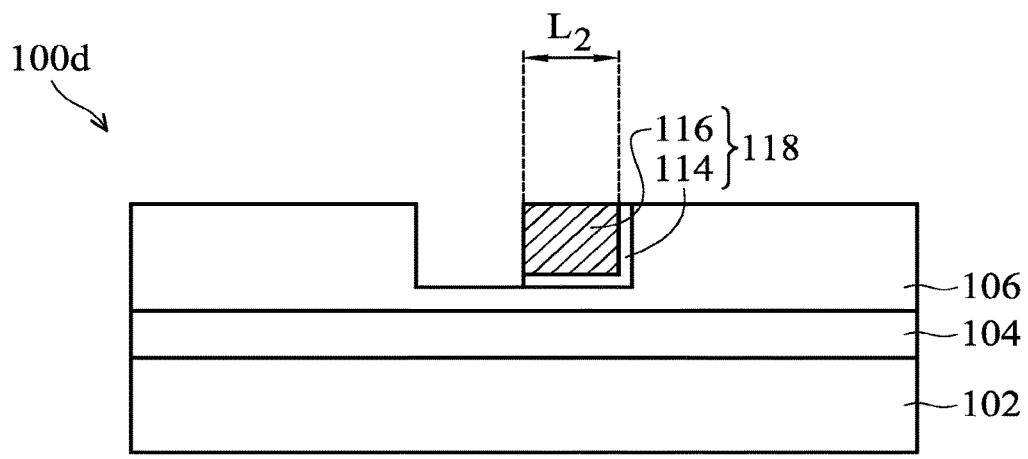
FIGS. 5B-5C show cross-sectional representations of various stages of forming a FinFET device structure, in accordance with some embodiments of the disclosure.
Figure 5C:
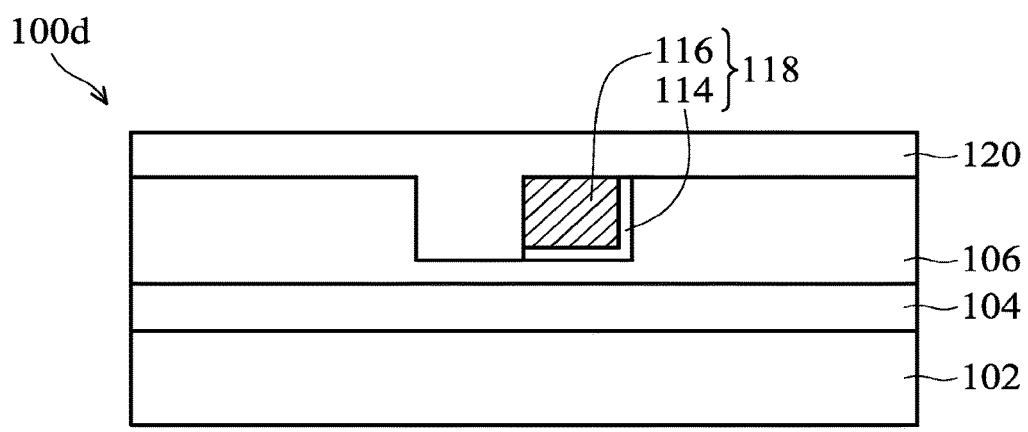

FIGS. 5B-5C show cross-sectional representations of various stages of forming a FinFET device structure 100d, in accordance with some embodiments of the disclosure.

As shown in FIG. 5B, a portion of the U-shaped trench 112 is filled by the gate electrode layer 116, and a portion of the U-shaped trench 112 is empty.

Afterwards, the ILD structure 120 is filled into the empty portion of the U-shaped trench 112.

As mentioned above, the FinFET device structures 100a, 100b, 100c and 100d have ultra-thin bodies (such as second portion 106b of the semiconductor layer 106), and the performance of the FinFET device structures have been improved. The FinFET device structures 100a, 100b, 100c and 100d have a high Ion/Ioff, a negligible DIBL, a low SS value, high saturation current, high electron density, and fast electron velocity.

Embodiments for forming a semiconductor device structure and method for formation the same are provided. A FinFET structure includes an oxide layer over a substrate, and a fin structure formed over the oxide layer. The fin structure is made of a semiconductor layer, and the fin structure includes a source structure, a channel region and a drain structure. The source structure, the channel region and the drain structure construct a U-shaped trench, and a gate structure formed in the U-shaped trench. The channel region has a thin thickness to form the FinFET device structure with an ultra-thin body (UTB). The FinFET device structure has a high Ion/Ioff, a negligible DIBL, a low SS value, high saturation current, high electron density and fast electron velocity. Therefore, the performance of the FinFET device structure is improved.

In some embodiments, a FinFET device structure is provided. The FinFET device structure includes an oxide layer formed over a substrate and a fin structure formed over the oxide layer. The fin structure is made of a semiconductor layer, and the semiconductor layer includes a first portion, a second portion and the third portion, the second portion is between the first portion and the third portion. The first portion, the second portion and the third portion construct a U-shaped trench, and the second portion is below the U-shaped trench. The FinFET device structure further includes a gate structure formed in the U-shaped trench.

In some embodiments, a method for forming a FinFET device structure is provided. The FinFET device structure includes an oxide layer formed over a substrate and a source structure, a channel region and a drain structure formed over the oxide layer. The source structure, the channel region and the drain structure construct a U-shaped trench, and the channel region is formed below a bottom surface of the U-shaped trench. The FinFET device structure also includes a gate structure filled in one portion of the U-shaped trench.

In some embodiments, a method for forming a semiconductor device structure is provided. The method includes forming an oxide layer over a substrate and forming a semiconductor layer over the oxide layer. The method includes patterning the semiconductor layer to form a fin structure over the oxide layer and removing a portion of the fin structure to form a U-shaped trench in the fin structure. The method also includes forming a gate structure on the U-shaped trench.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method for forming a fin field effect transistor (FinFET) device structure, comprising:
    forming an oxide layer over a substrate;
    forming a semiconductor layer over the oxide layer;
    patterning the semiconductor layer to form a first fin structure and a second fin structure over the oxide layer;
    removing a portion of each of the first and second fin structures to form a U-shaped trench in each of the first fin structure and the second fin structure; and
    forming a gate structure over the U-shaped trenches, wherein the gate structure extends from the U-shaped trench of the first fin structure to the U-shaped structure of the second fin structure.

2. The method for forming the fin field effect transistor (FinFET) device structure as claimed in claim 1, and before patterning the semiconductor layer further comprising:
    doping the semiconductor layer.

3. The method for forming the fin field effect transistor (FinFET) device structure as claimed in claim 1, wherein removing includes using a dry etching process.

4. The method for forming the fin field effect transistor (FinFET) device structure as claimed in claim 1, further comprising:
    removing a portion of the gate structure outside the U-shaped trench, wherein a top surface of the gate structure is level with a top surface of the semiconductor layer.

5. The method for forming the fin field effect transistor (FinFET) device structure as claimed in claim 1, wherein the forming the gate structure includes disposing a portion of the gate structure on a top surface of the first fin outside of the U-shaped trench.

6. The method for forming the fin field effect transistor (FinFET) device structure as claimed in claim 1, wherein the forming the gate structure includes disposing a first portion of the gate structure on a first region of a top surface of the first fin adjacent the U-shaped trench and disposing a second portion of the gate structure on a second region of the top surface of the first fin adjacent the U-shaped trench, wherein the U-shaped trench interposes the first region and the second region.

7. The method for forming the fin field effect transistor (FinFET) device structure as claimed in claim 1, wherein the removing the portion of the first fin structure to form the U-shaped trench includes forming a bottom surface and a sidewall of the U-shaped trench wherein an angle between the bottom surface and the sidewall is between about 85 degrees and about 95 degrees.

8. The method for forming the fin field effect transistor (FinFET) device structure as claimed in claim 1, further comprising: forming a channel of the FinFET device structure in the semiconductor layer under the U-shaped trench.

9. The method for forming the fin field effect transistor (FinFET) device structure as claimed in claim 1, wherein the removing the portion of each of the first and second fin structures includes performing a reactive-ion etching process.

10. The method for forming the fin field effect transistor (FinFET) device structure as claimed in claim 1, wherein the forming the gate structure includes forming at least one dummy gate layer which is subsequently replaced.

11. A method of fabricating a semiconductor device, the method comprising:
   forming a fin structure extending above a substrate;
   etching a portion of the fin structure to form a first region having a first height interposing second and third regions having a second height, the second height greater than the first height; and
   depositing a gate structure over the fin structure wherein the gate structure is over the first region and at least one of the second or third regions of the fin structure.

12. The method of claim 11, wherein the depositing the gate structure includes forming the gate structure over the first region, the second region, and the third region.

13. The method of claim 11, wherein the first region includes a first portion and a second portion, wherein the gate structure is deposited over the first portion and an interlayer dielectric (ILD) layer is formed over the second portion.

14. The method of claim 13, wherein the ILD layer is deposited using one of a chemical vapor deposition (CVD), physical vapor deposition (PVD), or spin-on coating.

15. The method of claim 11, wherein the depositing the gate structure includes depositing a gate dielectric layer and a gate electrode layer over the first region and at least one of the second or third regions.

16. A method of fabricating a fin field effect transistor (FinFET) device, the method comprising:
   providing a substrate having a fin extending from the substrate;
   etching a U-shaped trench over a channel region of the fin;
   forming a gate structure in at least one portion of the U-shaped trench;
   after forming the gate structure, depositing a dielectric layer filling in at least another portion of the U-shaped trench, such that the dielectric layer interfaces the bottom surface of the U-shaped trench within the at least another portion of the U-shaped trench.

17. The method of claim 16, wherein the etching the U-shaped trench includes a dry etching process.

18. The method of claim 16, wherein the depositing the dielectric layer includes depositing a low-k dielectric material.

19. The method of claim 16, wherein the forming the gate structure provides the gate structure having a top surface coplanar with a top surface of the fin.

20. The method of claim 16, further comprising: doping the fin prior to the etching the U-shaped trench.

* * * * *